(12) United States Patent
Chang

(10) Patent No.: US 8,451,597 B2
(45) Date of Patent: May 28, 2013

(54) ELECTRONIC DEVICE

(75) Inventor: Yao-Ting Chang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 237 days.

(21) Appl. No.: 12/858,559

(22) Filed: Aug. 18, 2010

(65) Prior Publication Data

US 2011/0228466 A1    Sep. 22, 2011

(30) Foreign Application Priority Data

Mar. 17, 2010   (CN) .......................... 2010 1 0125598

(51) Int. Cl.
*H05K 5/00*    (2006.01)
*H05K 7/00*    (2006.01)

(52) U.S. Cl.
USPC ................................. 361/679.32; 361/679.31

(58) Field of Classification Search
USPC ........................ 361/679.31, 679.32
See application file for complete search history.

(56) References Cited

U.S. PATENT DOCUMENTS

| | | | | |
|---|---|---|---|---|
| 6,138,839 A * | 10/2000 | Cranston et al. | ............ | 211/41.17 |
| 7,310,241 B2 * | 12/2007 | Peng et al. | ..................... | 361/801 |
| 7,646,595 B2 * | 1/2010 | Barsun et al. | ............. | 361/679.31 |
| 7,881,062 B2 * | 2/2011 | Chen et al. | ..................... | 361/725 |
| 7,929,288 B1 * | 4/2011 | Ma et al. | .................. | 361/679.32 |

* cited by examiner

*Primary Examiner* — Anthony Haughton
(74) *Attorney, Agent, or Firm* — Altis Law Group, Inc.

(57) ABSTRACT

An electronic device includes a housing, at least one expansion card, a motherboard and a fixing member. The motherboard is assembled into the housing, and includes at least one socket member. The socket member defines at least one expansion slot to receive the expansion card. The housing includes a bottom plate and a side plate extending substantially perpendicular to the bottom plate. The fixing member is rotatably connected to the side plate. The fixing member resists an end of the expansion card away from the motherboard, such that the fixing member and the motherboard cooperatively defining an airflow channel therebetween.

20 Claims, 2 Drawing Sheets

ELECTRONIC DEVICE

BACKGROUND

1. Technical Field

The present disclosure relates to electronic devices, and particularly, to an electronic device having an expansion card.

2. Description of the Related Art

Electronic devices, such as personal computer and servers, are provide with some expansion functions via an expansion card. The expansion card is usually arranged on a motherboard of the electronic devices.

A typical electronic device includes a housing, a motherboard, an expansion card and a fixing structure. The motherboard is assembled into the housing, and includes a socket member. The socket member defines an expansion slot. The expansion card is partially received in the expansion slot. The fixing structure is arranged at a side wall of the housing perpendicular to the socket member. The fixing structure is fixed on a side of the expansion card. The expansion card includes a contact sheet. The contact sheet includes a bending portion. The bending portion defines a circular hole. The fixing structure includes a fixing base and a plurality of screws. The fixing base defines a plurality of mounting grooves and a plurality of threaded holes adjacent to the corresponding mounting grooves. When the expansion card is initially mounted on the motherboard, the expansion card is partially inserted into the expansion slot of the socket member. The contact sheet is received in one of the mounting grooves. The screws pass through the circular hole of the bending portion and the threaded holes of the fixing base, such that the contact sheet is fixed to the fixing base. Therefore, the expansion card is fixed in the socket member. However, when the expansion card dissipates heat, a fan is assembled on a side of the expansion card away from the fixing structure. The cooling airflow blowing from the fan flows from one side of the expansion card adjoining the fan to the other side of the fan away from the socket member. The cooling airflow cannot flow through a side of the expansion card adjacent to the fixing structure. Therefore, the heat dissipating performance of the expansion card of the electronic device is inefficient.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views, and all the views are schematic.

DETAILED DESCRIPTION

Figure 1:
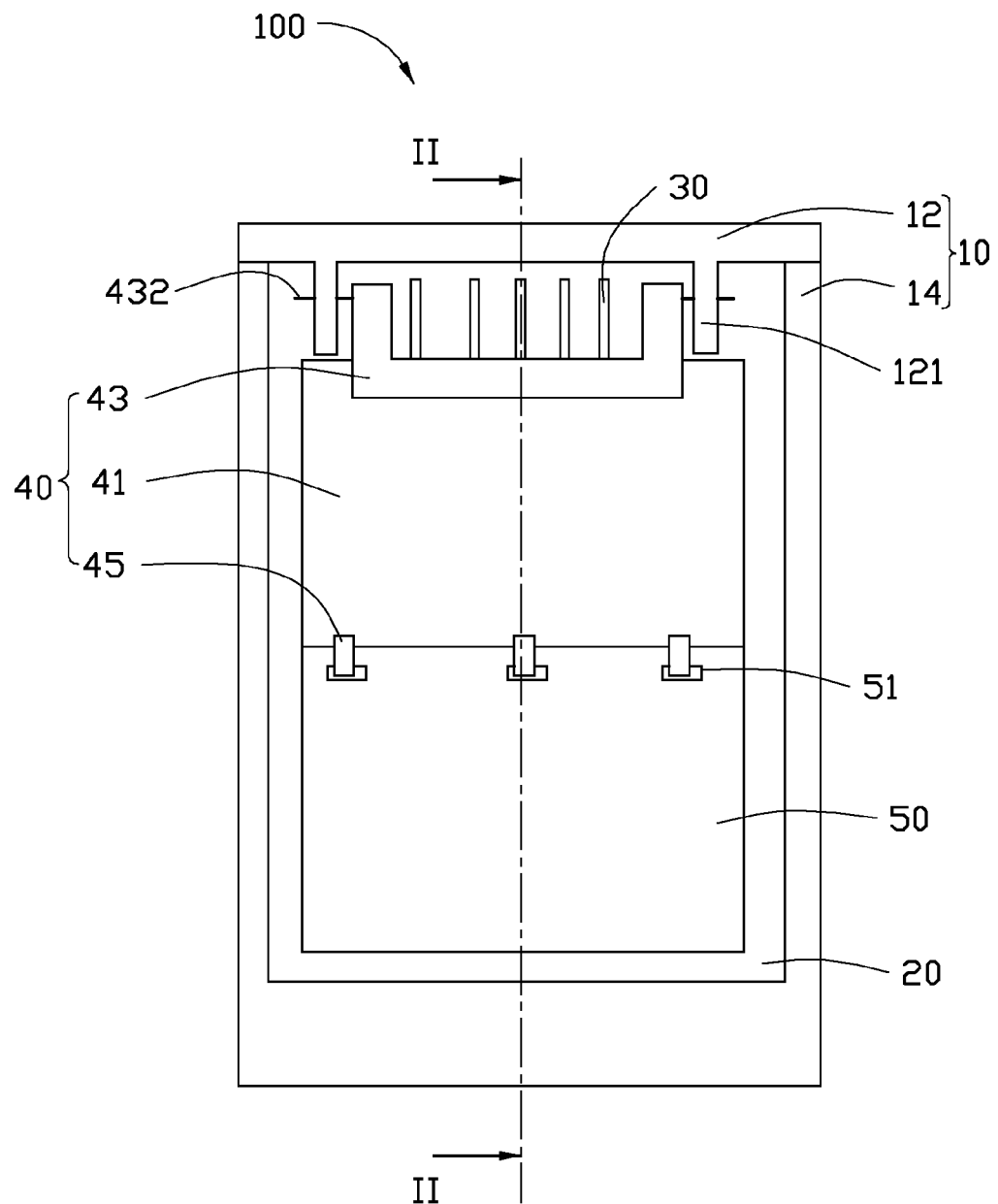
FIG. 1 is a partial, top plane view of one embodiment of an electronic device.

Referring to FIG. 1, an embodiment of an electronic device 100 includes a housing 10, a motherboard 20, a plurality of expansion cards 30, a fixing member 40 and an airflow guide 50. The motherboard 20 is fixed in the housing 10. The expansion cards 30 are electrically connected to the motherboard 20. The fixing member 40 is fixed in the housing 10, and partially resists a top end of the expansion cards 30 away from the motherboard 20. The airflow guide 50 is connected to the fixing member 40. The electronic device 100 can be a personal computer or a server. In the illustrated embodiment, the electronic device 100 is a personal computer.

Figure 2:
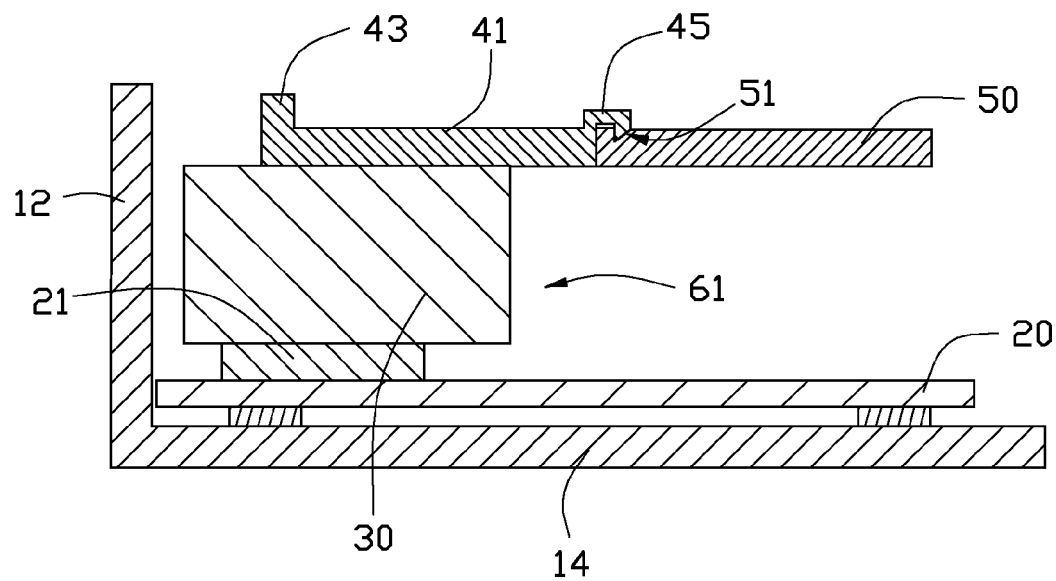
FIG. 2 is a cross-section taken along line II-II of FIG. 1.

Referring to FIG. 2, the housing 10 includes a side plate 12 and a bottom plate 14. The side plate 12 extends substantially perpendicular to the bottom plate 14. The side plate 12 includes two connecting protrusions 121 assembled on an inner surface of the side plate 12. Each connecting protrusion 121 defines a shaft hole (not shown).

The motherboard 20 is fixed on the bottom plate 14 of the housing 10. The motherboard 20 includes a plurality of socket members 21 parallel to each other. Each socket member 21 defines an expansion slot (not shown).

The plurality of expansion cards 30 are parallel to each other, and are substantially perpendicularly inserted into the expansion slots of the socket members 21.

The fixing member 40 includes a plate 41, a first connecting portion 43 and two second connecting portion 45. The plate 41 is substantially rectangular. The first connecting portion 43 and the second connecting portions 45 are located on opposite ends of an outer surface of the plate 41. In the illustrated embodiment, the first connecting portion 43 is substantially U-shaped, and includes two shafts 432 located on opposite ends of the first connecting portion 43. Each shaft 432 passes through the shaft hole of the corresponding connecting protrusion 121, such that the fixing member 40 is rotatably connected to the side plate 12 of the housing 10. In the illustrated embodiment, the second connecting portion 45 is a hook extending from the plate 41.

The airflow guide 50 is substantially U-shaped, and defines an air inlet (not labeled) and an air outlet (not labeled) opposite to the air inlet. The airflow guide 50 further defines a plurality of latching grooves 51. The second connecting portions 45 are engaged in the latching grooves 51, respectively, such that the fixing member 40 is connected to the airflow guide 50.

Referring to FIGS. 1 and 2 again, to assemble the electronic device 100, initially the motherboard 20 is attached on the bottom plate 14 of the housing 10. The plurality of the expansion cards 30 are partially inserted into the expansion slots of the socket members 21. The fixing member 40 resists an end of the expansion cards 30 away from the motherboard 20. Each of the shafts 432 of the first connection portion 43 passes through the corresponding shaft hole of the connecting protrusions 121, so that the fixing member 40 is rotatably connected to the side plate 12 of the housing 10. The second connecting portions 45 are engaged in the latching grooves 51 of the airflow guide 50, such that the fixing member 40 is connected to the airflow guide 50.

When dissipating heat from the expansion cards 30, a fan is located adjacent to the air inlet of the airflow guide 50. The fixing member 40 resists the end of the expansion cards 30 away from the motherboard 20, such that an airflow channel is formed between the airflow guide 50 and the motherboard 20. The air flows into the airflow channel, such that the air flows from one side of the expansion cards 30 away from the side plate 12 to the other side of the expansion cards 30 adjacent to the side plate 12. Therefore, the airflow can dissipate heat produced by the expansion card more efficiently, such that the heat dissipating performance of the electronic device 100 is improved by the fixing member 40.

Furthermore, the fixing member 40 partially covers the expansion cards 30, such that an end of the expansion cards 30 adjacent to the side plate 12 are exposed. The air can flow from the above end of the expansion cards 30 more quickly, thereby increasing the efficiency of heat dissipation of the expansion cards 30.

The fixing member 40 is rotatably connected to the side plate 12 of the housing 10, and detachably connected to the airflow guide 50, thereby the expansion cards 30 are mounted on or disassembled from the motherboard 20 more conveniently.

It is to be understood that fixing member 40 can also be fixed to the side plate 12 of the housing by another method. For example, the fixing member 40 can be fixed to the side plate 12 by a threaded member. The fixing member 40 can also be fixed to the bottom plate 14 of the housing or the airflow guide 50. The fixing member 40 can be fixed to the airflow guide 50 without being limited by the hook and the latching groove 51. The number of the expansion cards 30 can be just one, correspondingly, the number of the socket member 21 can also be just one.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. An electronic device comprising:
    a housing;
    a motherboard fixed in the housing and comprising a socket member, the socket member defining an expansion slot;
    an expansion card comprising a first end, and a second end opposite to the first end and facing away from the motherboard, the first end comprising a connecting portion inserted into the expansion slot of the socket member; and
    a fixing member resisting the second end of the expansion card facing away from the motherboard, the fixing member and the motherboard cooperatively defining an airflow channel between the fixing member and the motherboard;
    wherein the connecting portion of the first end and the second end are both sandwiched between the fixing member and the motherboard.

2. The electronic device of claim 1, wherein the housing comprises a bottom plate and a side plate, the side plate extending substantially perpendicular to the bottom plate.

3. The electronic device of claim 2, wherein the fixing member is rotatably connected to the side plate.

4. The electronic device of claim 2, further comprising an airflow guide fixed to the fixing member and configured to dissipate heat produced by the expansion card, wherein the airflow guide is above a side of the motherboard on which the socket member is positioned and does not contact the motherboard, and the airflow channel is further defined between the airflow guide and the motherboard.

5. The electronic device of claim 4, wherein the fixing member comprises a plate, and a first connecting portion and a second connecting portion located on opposite ends of an outer surface of the plate; the first connecting portion is rotatably connected to the side plate; and the second connecting portion is fixed to the airflow guide.

6. The electronic device of claim 5, wherein the first connecting portion comprises two shafts, the side plate comprising two connecting protrusions, and each connecting protrusion defining a shaft hole to receive the corresponding shaft.

7. The electronic device of claim 5, wherein the airflow guide defines a plurality of latching grooves, and the second connecting portion comprises a plurality of hooks engaging in the latching grooves, respectively.

8. An electronic device comprising:
    a housing;
    a motherboard fixed in the housing and comprising a socket member;
    an expansion card electrically connected to the motherboard at the socket member, and comprising a first end facing close to the motherboard and a second end opposite to the first end and facing away from the motherboard; and
    a fixing member partially covering the second end of the expansion card opposite to the first end and facing away from the motherboard, wherein the fixing member and the motherboard cooperatively define an airflow channel between the fixing member and the motherboard;
    wherein part of the socket member abuts a middle portion of the first end of the expansion card, part of the fixing member resists a middle portion of the second end of the expansion card, and the middle portion of the first end of the expansion card in abutment with said part of the socket member is directly opposite the middle portion of the second end of the expansion card resisted by said part of the fixing member, such that said part of the socket member and said part of the fixing member directly sandwich the middle portion of the first end of the expansion card and the middle portion of the second end of the expansion card therebetween.

9. The electronic device of claim 8, wherein the housing comprises a bottom plate and a side plate extending substantially perpendicular to the bottom plate.

10. The electronic device of claim 9, wherein the fixing member is rotatably connected to the side plate.

11. The electronic device of claim 9, further comprising an airflow guide fixed to the fixing member and configured to dissipate heat produced by the expansion card, wherein the airflow guide is above a side of the motherboard on which the socket member is positioned and does not contact the motherboard, and the airflow channel is further defined between the airflow guide and the motherboard.

12. The electronic device of claim 11, wherein the fixing member comprises a plate, and a first connecting portion and a second connecting portion located on opposite ends of an outer surface of the plate; the first connecting portion is rotatably connected to the side plate; and the second connecting portion is fixed to the airflow guide.

13. The electronic device of claim 12, wherein the first connecting portion comprises two shafts, the side plate comprising two connecting protrusions, and each connecting protrusion defining a shaft hole to receive the corresponding shaft.

14. The electronic device of claim 12, wherein the airflow guide defines a plurality of latching grooves, and the second connecting portion comprises a plurality of hooks engaging in the latching grooves, respectively.

15. An electronic device comprising:
    a housing;
    a motherboard fixed in the housing and comprising a socket member positioned on a side of the motherboard;
    an expansion card comprising:
        a first end received in the socket member of the motherboard and an opposite second end; and
        a first side between the first and second ends and an opposite second side between the first and second ends;
        wherein the first end, the first side, the second end and the second side are connected end to end in that sequence and cooperatively define a largest profile of the expansion card;

a fixing member resisting the second end of the expansion card;

an airflow guide being above the side of the motherboard on which the socket member is positioned and fixed with the fixing member, the airflow guide configured to dissipate heat produced by the expansion card and defining an air inlet far from the expansion card and an air outlet opposite to the air inlet and adjacent to the expansion card;

wherein the airflow guide does not contact the motherboard, and the airflow guide and the motherboard cooperatively define an airflow channel between the airflow guide and the motherboard, such that an airflow which flows out from the air outlet of the airflow guide flows from one of the first and second sides of the expansion card to the other one of the first and second sides of the expansion card.

16. The electronic device of claim 15, wherein the first end comprises a connecting portion inserted into the socket member of the motherboard, and the connecting portion of the first end and the second end of the expansion card are both sandwiched between the fixing member and the motherboard.

17. The electronic device of claim 16, wherein the housing comprises a bottom plate and a side plate extending substantially perpendicular to the bottom plate, and the fixing member is rotatably connected to the side plate.

18. The electronic device of claim 17, wherein the fixing member comprises a plate, and a first connecting portion and a second connecting portion located on opposite ends of an outer surface of the plate; the first connecting portion is rotatably connected to the side plate; and the second connecting portion is fixed to the airflow guide.

19. The electronic device of claim 18, wherein the first connecting portion comprises two shafts, the side plate comprising two connecting protrusions, and each connecting protrusion defining a shaft hole to receive the shaft.

20. The electronic device of claim 18, wherein the airflow guide defines a plurality of latching grooves, and the second connecting portion comprises a plurality of hooks engaging in the latching grooves, respectively.

\* \* \* \* \*